(12) United States Patent
Ta et al.

(10) Patent No.: US 6,385,046 B1
(45) Date of Patent: May 7, 2002

(54) HEAT SINK ASSEMBLY HAVING INNER AND OUTER HEATSINKS

(75) Inventors: Peter Cuong Dac Ta, Hayward; Vernon P. Bollesen, Milpitas, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/661,590

(22) Filed: Sep. 14, 2000

(51) Int. Cl.[7] ................................................. H05K 7/20
(52) U.S. Cl. ..................... 361/704; 29/890.03; 361/719; 454/184
(58) Field of Search .............................. 174/15.1, 16.1, 174/16.3; 165/80.3, 185; 454/184; 257/722; 312/223.1; 361/687, 690, 703, 704, 709, 710, 713, 717–719; 29/832, 840, 890.03

(56) References Cited

U.S. PATENT DOCUMENTS

| | | | | |
|---|---|---|---|---|
| 3,909,679 A | * | 9/1975 | Petri | 361/710 |
| 5,105,336 A | * | 4/1992 | Jacoby et al. | 361/690 |
| 5,497,289 A | * | 3/1996 | Sugishima et al. | 361/709 |
| 5,598,320 A | * | 1/1997 | Toedtman et al. | 361/687 |
| 5,608,610 A | * | 3/1997 | Brzezinski | 361/704 |
| 5,761,041 A | | 6/1998 | Hassanzadeh et al. | 361/704 |
| 5,898,569 A | * | 4/1999 | Bhatia | 361/700 |
| 5,946,192 A | * | 8/1999 | Ishigami et al. | 361/704 |
| 6,067,230 A | * | 5/2000 | Ashida et al. | |
| 6,104,602 A | * | 8/2000 | Morris et al. | 361/678 |
| 6,147,867 A | * | 11/2000 | Gaudrel et al. | 361/707 |
| 6,167,949 B1 | * | 1/2001 | Langley | |
| 6,175,494 B1 | * | 1/2001 | Komatsu | |

\* cited by examiner

Primary Examiner—Gerald Tolin
(74) Attorney, Agent, or Firm—Gunnison, McKay & Hodgson, L.L.P.; Serge J. Hodgson

(57) ABSTRACT

A heat sink structure includes a heat emitting component, an inner heat sink in thermal contact with the heat emitting component, a cabinet of a computer system in thermal contact with the inner heat sink, and an outer heat sink in thermal contact with the cabinet. The cabinet defines an outer region outside of the computer system and an inner region inside of the computer system. Generally, the outer region is cooler than the inner region. Advantageously, since the outer heat sink is located in the outer region, the outer heat sink is relatively cool compared to the heat emitting component. This drives heat from the heat emitting component through the inner heat sink and the cabinet to the outer heat sink, which dissipates this heat to the outer region outside of the computer system.

20 Claims, 3 Drawing Sheets

HEAT SINK ASSEMBLY HAVING INNER AND OUTER HEATSINKS

BACKGROUND OF THE INVENTION

1. Field of the Invention

The present invention relates generally to cooling of electronic components in electronic devices. More particularly, the present invention relates to a heat sink structure, which utilizes a cabinet of an electronic device.

2. Description of the Related Art

As the art moves towards higher power integrated circuits and components, hereinafter referred to as heat emitting components, heat transfer from the heat emitting components becomes increasingly difficult and more important. One conventional technique to remove heat from a heat emitting component was to employ a finned heat sink which was placed in thermal contact with the heat emitting component. In this manner, heat generated by the heat emitting component was conducted to the heat sink and then dissipated to the ambient environment.

Hassanzadeh et al., U.S. Pat. No. 5,761,041, which is herein incorporated by reference in its entirety, teaches a finned heat sink which was placed in thermal contact with a heat emitting component. To mount the heat sink, a bolster plate was positioned below a printed circuit board, and two pins extended up from the bolster plate, through the printed circuit board and through the base of the heat sink. A spring, engaged with the two pins, pressed the heat sink into thermal contact with the heat emitting component.

Although the heat sink of Hassanzadeh et al. was suitable for its intended purpose, in some applications, there was only limited space for the heat sink. In these applications, the size of the heat sink, which could be placed in the limited space, was not adequate to sufficiently cool the heat emitting component. To enhance heat transfer from the heat emitting component and heat sink in this event, additional and/or more powerful fans were often used. However, to avoid excess power consumption and to avoid exceeding noise level limits, the size of these additional and/or more powerful fans was severely restricted.

Accordingly, the art needs a method of enhancing heat transfer from a heat emitting component where there is only limited space for a heat sink and without providing additional and/or more powerful fans.

SUMMARY OF THE INVENTION

In accordance with the present invention, a heat sink structure includes a heat emitting component, an inner heat sink in thermal contact with the heat emitting component, a cabinet of a computer system in thermal contact with the inner heat sink, and an outer heat sink in thermal contact with the cabinet.

The cabinet defines an outer region outside of the computer system and an inner region inside of the computer system. Generally, the outer region is cooler than the inner region. Advantageously, since the outer heat sink is located in the outer region, the outer heat sink is relatively cool compared to the heat emitting component. This drives heat from the heat emitting component through the inner heat sink and the cabinet to the outer heat sink, which dissipates this heat to the outer region outside of the computer system.

In one particular embodiment, a heat sink structure includes an inner heat sink having a first heat transfer surface, a cabinet, and a second heat sink having an end plate, which includes a second heat transfer surface. A first screw passes through a first aperture in the cabinet and is threaded into a first threaded aperture in the first heat transfer surface of the inner heat sink. Similarly, a second screw passes through a second aperture in the cabinet and is threaded into a second threaded aperture in the first heat transfer surface of the inner heat sink. In this manner, the inner heat sink is mounted to the cabinet.

Heads of the first and second screws protrude into cavities in the outer heat sink. In this manner, the outer heat sink provides clearance for the heads of the first and second screws.

A third screw passes through a first aperture in the outer heat sink, through a third aperture in the cabinet and is threaded into a third threaded aperture in the inner heat sink. Similarly, a fourth screw passes through a second aperture in the outer heat sink, through a fourth aperture in the cabinet and is threaded into a fourth threaded aperture in the inner heat sink. In this manner, the outer heat sink is mounted to the cabinet.

Also in accordance with the present invention, a method includes thermally connecting an inner heat sink to a heat emitting component. The inner heat sink is thermally connected through a cabinet to an outer heat sink. The heat emitting component generates heat and this heat is conducted to the inner heat sink, to the cabinet, and to the outer heat sink, which dissipates the heat to the outer region outside of the computer system.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
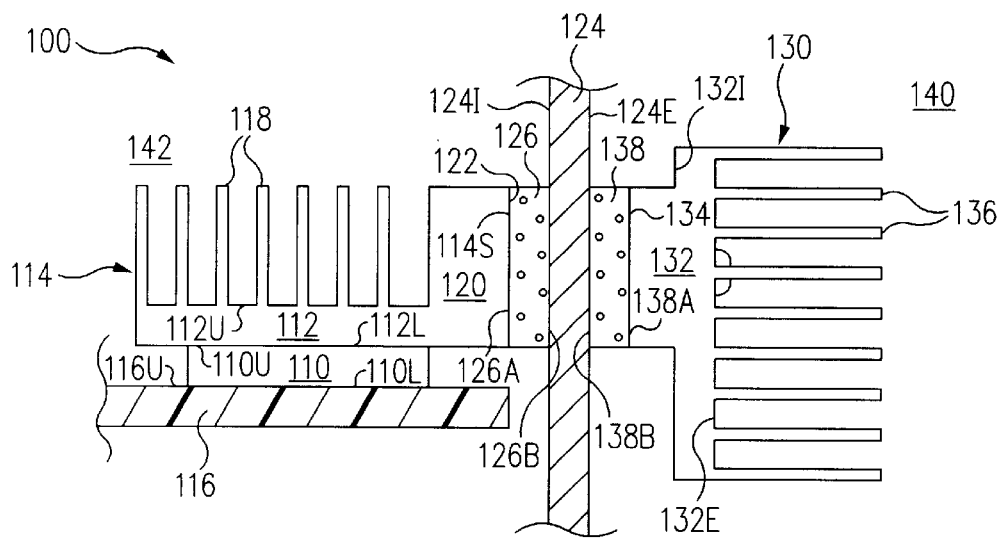
FIG. 1 is a side plan view of a heat sink structure in accordance with the present invention.

In accordance with the present invention, a heat sink structure 100 (FIG. 1) includes a heat emitting component 110, an inner heat sink 114 in thermal contact with heat emitting component 110, a cabinet 124 in thermal contact with inner heat sink 114, and an outer heat sink 130 in thermal contact with cabinet 124.

Cabinet 124 defines an outer region 140 outside of the system and an inner region 142 inside of the system. Generally, outer region 140 is cooler than inner region 142. Advantageously, since outer heat sink 130 is located in outer region 140, outer heat sink 130 is relatively cool compared to heat emitting component 110. This drives heat from heat emitting component 110 through inner heat sink 114 and cabinet 124 to outer heat sink 130, which dissipates this heat to outer region 140 outside of the system.

More particularly, FIG. 1 is a side plan view of a heat sink structure 100 in accordance with the present invention. Referring to FIG. 1, an upper, e.g., first, surface 110U of a heat emitting component 110 is in thermal contact with a lower, e.g., first, surface 112L of a base section 112 of an inner, e.g., first, heat sink 114. A lower, e.g., second, surface 110L of heat emitting component 110 is attached to an upper, e.g., first, surface 116U of a substrate 116 such as a printed circuit board.

Inner heat sink 114, heat emitting component 110, and substrate 116 are assembled in a conventional manner, for example, using a bolster plate, pins, screws, clips, adhesives and/or solder or a combination thereof. The particular manner in which inner heat sink 114, heat emitting component 110, and substrate 116 are assembled is not essential to the invention.

Inner heat sink 114 includes a plurality of fins 118 extending vertically, e.g., in a first direction, from an upper, e.g., second, surface 112U of base section 112. Inner heat sink 114 further includes an end plate 120, sometimes called a first end plate, attached to base section 112 along an outermost side 114S of inner heat sink 114. In accordance with this embodiment, end plate 120 has a planar heat transfer surface 122, sometimes called a first heat transfer surface, which is perpendicular to lower surface 112L of base section 112 of inner heat sink 114.

In this embodiment, base section 112, fins 118, and end plate 120 are integral, i.e., inner heat sink 114 is a single piece, e.g., of metal such as copper or aluminum, and not a plurality of separate pieces connected together. However, in one alternative embodiment, end plate 120 is a separate piece, which is mounted to inner heat sink 114, e.g., with pins, screws, clips, adhesives and/or solder or a combination thereof. Further, although inner heat sink 114 having fins 118 is described and illustrated in the figures, in light of this disclosure, those of skill in the art will understand that other heat sinks are used in other embodiments. For example, inner heat sink 114 is a plate or tower type heat sink in other embodiments.

End plate 120, and more particularly, heat transfer surface 122 of end plate 120, is in thermal contact with a cabinet 124, sometimes called a cover or a lid. To illustrate, structure 100 is part of a larger system such as a computer system, and cabinet 124 is the outer cover of the system. However, as used herein, the term cabinet generally refers to any rigid structure. Preferably, cabinet 124 has a relatively high thermal conductivity, for example, cabinet 124 is metal.

A thermal pad 126, sometimes called a first thermal pad, such as an elastomer having a thermally conductive filler, e.g., aluminum oxide and/or boron nitride, is interposed between end plate 120 and cabinet 124 although other materials such as thermally conductive grease can be used. More generally, thermal pad 126 is interposed between inner heat sink 114 and cabinet 124. Thermal pad 126 is compliant thus compensating for any mismatch in physical characteristics and thermal expansion between end plate 120 and cabinet 124. Further, thermal pad 126 has a high thermal conductivity thus improving heat transfer between end plate 120 and cabinet 124 although, in an alternative embodiment, thermal pad 126 is not used and end plate 120 directly contacts cabinet 124.

As shown in FIG. 1, heat transfer surface 122 of end plate 120 is in direct contact with a first surface 126A of thermal pad 126. A second surface 126B of thermal pad 126 is in direct contact with an interior, e.g., first, surface 124I of cabinet 124.

An exterior, e.g., second, surface 124E of cabinet 124 and, more generally, cabinet 124, is in thermal contact with an outer, e.g., second, heat sink 130. Outer heat sink 130 includes an end plate 132, sometimes called a second end plate. End plate 132 has a planar heat transfer surface 134. A plurality of fins 136 extend horizontally, e.g., in a second direction perpendicular to the first direction, from end plate 132. More particularly, heat transfer surface 134 is located at an interior, e.g., first, surface 132I of end plate 132 and fins 136 extend from an exterior, e.g., second, surface 132E of end plate 132.

In this embodiment, fins 136 and end plate 132 are integral, i.e., outer heat sink 130 is a single piece, e.g., of metal such as copper or aluminum, and not a plurality of separate pieces connected together. However, in one alternative embodiment, end plate 132 is a separate piece, which is mounted to outer heat sink 130, e.g., with pins, screws, clips, adhesives and/or solder or a combination thereof. Further, although outer heat sink 130 having fins 136 is described and illustrated in the figures, in light of this disclosure, those of skill in the art will understand that other heat sinks are used in other embodiments. For example, outer heat sink 130 is a plate or tower type heat sink in other embodiments.

A thermal pad 138, similar to thermal pad 126, is interposed between outer heat sink 130 and cabinet 124. Thermal pad 138 is compliant thus compensating for any mismatch in physical characteristics and thermal expansion between end plate 132 and cabinet 124. Further, thermal pad 138 has a high thermal conductivity thus improving heat transfer between end plate 132 and cabinet 124 although, in an alternative embodiment, thermal pad 138 is not used and end plate 132 directly contacts cabinet 124.

As shown in FIG. 1, heat transfer surface 134 of end plate 132 is in direct contact with a first surface 138A of thermal pad 138. A second surface 138B of thermal pad 138 is in direct contact with exterior surface 124E of cabinet 124.

Outer heat sink 130 and thermal pad 138 are positioned on cabinet 124 directly opposite of inner heat sink 114 and thermal pad 126. In this manner, thermal resistance between outer heat sink 130 and inner heat sink 114 is minimized thus enhancing heat transfer between outer heat sink 130 and inner heat sink 114.

During use, heat emitting component 110 generates heat. Illustratively, heat emitting component 110 includes a central processing unit (CPU) or other electronic component, which generates heat. This heat is conducted to inner heat sink 114 through lower surface 112L. Inner heat sink 114 dissipates some of this heat to the ambient environment. Fins 118 enhance this heat dissipation.

Further, some of the heat from inner heat sink 114 is conducted through thermal pad 126 to cabinet 124. In this embodiment, cabinet 124 is the outer metal cover of a system such as a computer system. Cabinet 124 defines an outer, e.g., first, region 140 outside of the system and an inner, e.g., second, region 142 inside of the system. Generally, outer region 140 is cooler than inner region 142. Heat emitting component 110 and inner heat sink 114 are located in inner region 142. However, since cabinet 124 is exposed directly to outer region 140, heat is readily dissipated from cabinet 124 to outer region 140, and more particular, to outside of the system.

Further, some of the heat from cabinet 124 is conducted through thermal pad 138 to outer heat sink 130. In this manner, outer heat sink 130 is in thermal contact with inner heat sink 114 and heat emitting component 110. Outer heat sink 130 dissipates this heat to the ambient environment and, more particularly, to outer region 140. Fins 136 enhance this heat dissipation.

Advantageously, since outer heat sink 130 is located in outer region 140, a large temperature differential exists between heat emitting component 110 and outer heat sink 130, i.e., outer heat sink 130 is relatively cool compared to heat emitting component 110. As is well known to those of skill in the art, conductive heat transfer between a first item and a second item is directly proportional to the temperature differential existing between the first item and the second item. Accordingly, the large temperature differential between outer heat sink 130 and heat emitting component 110 drives heat from heat emitting component 110 to outer heat sink 130, which dissipates this heat to the ambient environment, and more particularly, to outer region 140.

Recall that in the prior art, fans were utilized to remove heat from inside of the computer system. However, as the art moved to higher power components, the amount of heat, which had to be removed from the computer system, increased. This additional heat was removed by providing additional and/or more powerful fans. Disadvantageously, these additional and/or more powerful fans consumed more power, which increased the operating cost of the computer system. Further, these additional and/or more powerful fans resulted in an increase in noise, which was detrimental to the performance of the computer system.

In contrast, heat sink structure 100 in accordance with the present invention removes heat from inside of a system such as a computer system directly through cabinet 124 and to the outside environment. Advantageously, this heat is removed without having to power a fan and without generating noise. Accordingly, the prior art requirement of providing additional and/or more powerful fans is eliminated. Advantageously, operating costs are reduced and system performance is enhanced compared to the prior art.

Figure 3:
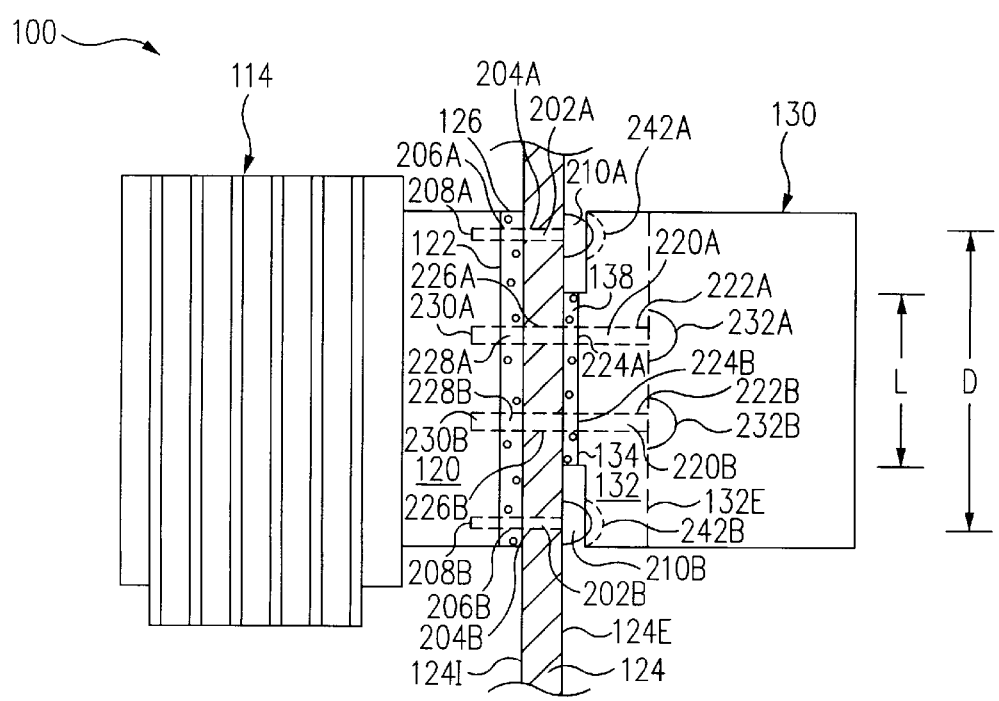
FIG. 3 is a top plan view of the heat sink structure of FIG. 2.
Figure 2:
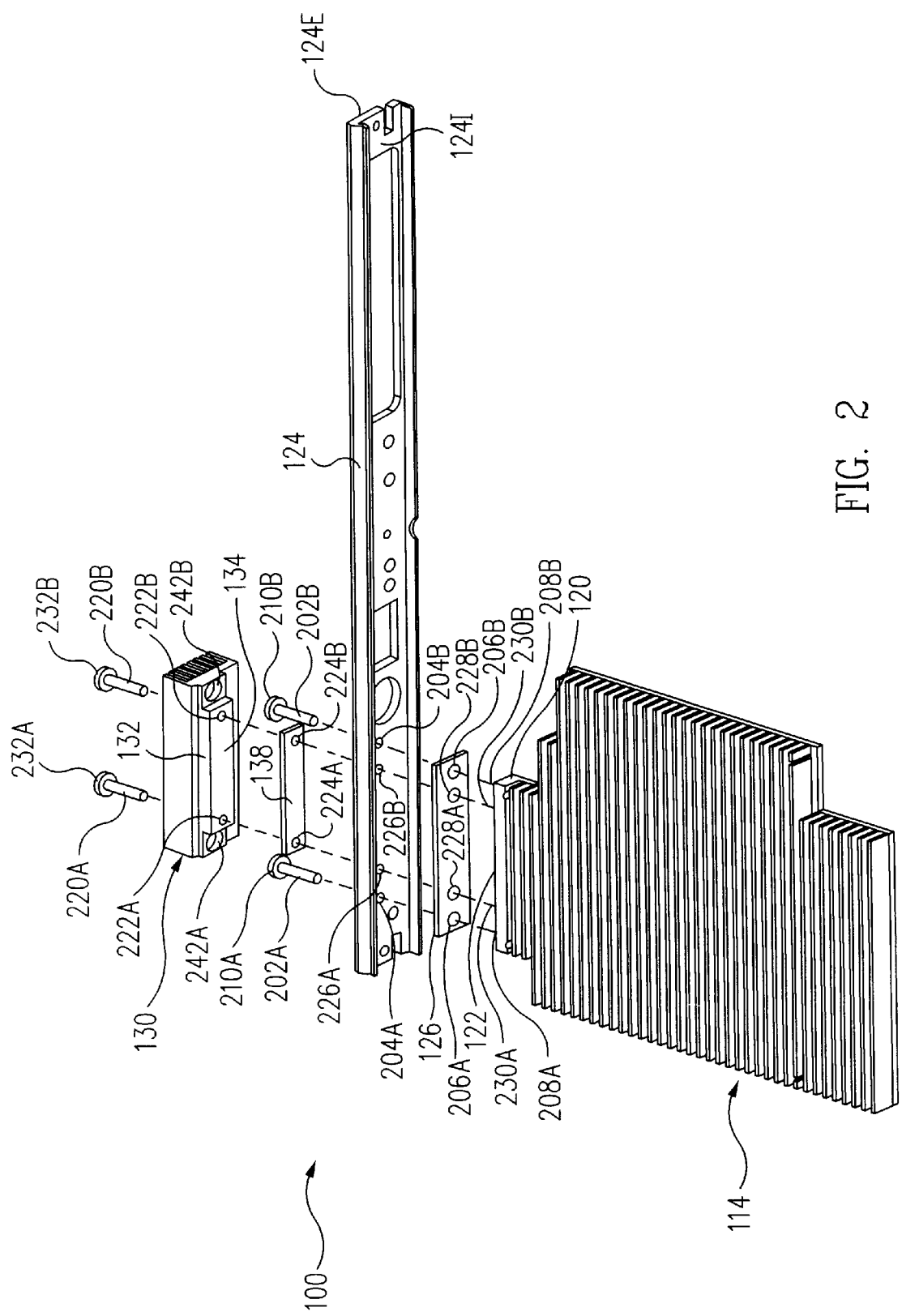
FIG. 2 is an exploded perspective view of heat sink structure in accordance with one embodiment of the present invention.

FIG. 2 is an exploded perspective view of heat sink structure 100 in accordance with one embodiment of the present invention. FIG. 3 is a top plan view of heat sink structure 100 of FIG. 2. In FIGS. 2 and 3, heat emitting component 110 and substrate 116 are not illustrated to avoid detracting from the principals of the invention.

Referring now to FIGS. 2 and 3 together, inner heat sink 114 and thermal pad 126 are mounted to cabinet 124 by a threaded screw 202A and a threaded screw 202B, collectively referred to as screws 202. More particularly, screw 202A passes through an aperture 204A in cabinet 124, passes through an aperture 206A in thermal pad 126 and is threaded into a threaded aperture 208A in heat transfer surface 122 of end plate 120. Similarly, screw 202B passes through an aperture 204B in cabinet 124, passes through an aperture 206B in thermal pad 126 and is threaded into a threaded aperture 208B in heat transfer surface 122 of end plate 120. Aperture 204A and aperture 204B, aperture 206A and aperture 206B, aperture 208A and aperture 208B are collectively referred to as apertures 204, 206, 208, respectively.

Screw 202A has a head 210A and screw 202B has a head 210B, head 210A and head 210B collectively referred to as heads 210. As screws 202 are threaded into apertures 208 in heat transfer surface 122 of end plate 120, heads 210 press against exterior surface 124E of cabinet 124. This, in turn, causes inner heat sink 114, and more particularly, heat transfer surface 122, to be pressed towards cabinet 124 thus compressing thermal pad 126 between heat transfer surface 122 and interior surface 124I of cabinet 124. In this manner, intimate thermal contact between inner heat sink 114 and cabinet 124 is assured.

Outer heat sink 130 is mounted to cabinet 124 by a threaded screw 220A and a threaded screw 220B, collectively referred to as screws 220. More particularly, screw 220A passes through an aperture 222A in end plate 132 of outer heat sink 130, passes through an aperture 224A in thermal pad 138, passes through an aperture 226A in cabinet 124, passes through an aperture 228A in thermal pad 126, and is threaded into a threaded aperture 230A in heat transfer surface 122 of end plate 120. Similarly, screw 220B passes through an aperture 222B in end plate 132 of outer heat sink 130, passes through an aperture 224B in thermal pad 138, passes through an aperture 226B in cabinet 124, passes through an aperture 228B in thermal pad 126, and is threaded into a threaded aperture 230B in heat transfer surface 122 of end plate 120. Aperture 222A and aperture 222B, aperture 224A and aperture 224B, aperture 226A and aperture 226B, aperture 228A and aperture 228B, aperture 230A and aperture 230B are collectively referred to as apertures 222, 224, 226, 228, 230, respectively.

Screw 220A has a head 232A and screw 220B has a head 232B, head 232A and head 232B collectively referred to as heads 232. As screws 220 are threaded into apertures 230, heads 232 press against exterior surface 132E of end plate 132 of outer heat sink 130. This, in turn, causes outer heat sink 130, and more particularly, heat transfer surface 134, to be pressed towards cabinet 124 thus compressing thermal pad 138 between heat transfer surface 134 and exterior surface 124E of cabinet 124. In this manner, intimate thermal contact between outer heat sink 130 and cabinet 124 is assured.

To allow clearance for heads 210 of screws 202, heat transfer surface 134 is elevated from end plate 132. Further, heat transfer surface 134 has a length L (FIG. 3) less than a distance D between head 210A and head 210B. In this manner, heat transfer surface 134 fits between heads 210 or, stated another way, presses against cabinet 124 between heads 210. In addition, end plate 132 of outer heat sink 130 includes a first cavity 242A and a second cavity 242B, collectively referred to as cavities 242. Cavities 242 are directly adjacent heat transfer surface 134. Head 210A protrudes into cavity 242A. Similarly, head 210B protrudes into cavity 242B. In the above manner, outer heat sink 130 provides clearance for heads 210 of screws 202.

To assemble heat sink structure 100, screws 202 are passed through apertures 204 in cabinet 124 and are passed through apertures 206 in thermal pad 126. Screws 202 are threaded into apertures 208 in heat transfer surface 122 of end plate 120. This compresses thermal pad 126 between cabinet 124 and end plate 120 thus mounting inner heat sink 114 and thermal pad 126 to cabinet 124.

Screws 220 are passed through apertures 222 in end plate 132, through apertures 224 in thermal pad 138, through apertures 226 in cabinet 124 and through apertures 228 in thermal pad 126. Screws 220 are threaded into apertures 230 in heat transfer surface 122 of end plate 120. This compresses thermal pad 138 between cabinet 124 and end plate 132 thus mounting outer heat sink 130 and thermal pad 138 to cabinet 124. As screws 220 are tightened, heads 210 of screws 202 enter into cavities 242 of outer heat sink 130.

Figure 4:
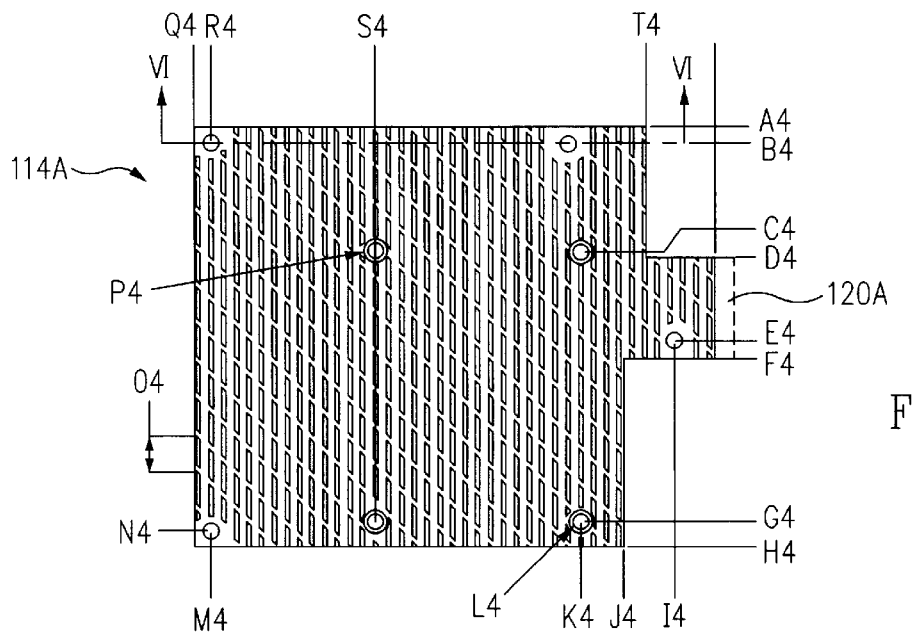
FIG. 4 is a top plan view of an inner heat sink in accordance with an alternative embodiment of the present invention.

FIG. 4 is a top plan view of an inner heat sink 114A in accordance with an alternative embodiment of the present invention. Illustrative specifications for the various characteristics illustrated in FIG. 4 are set forth below in Table 1.

TABLE 1

| CHARACTERISTIC | SPECIFICATION |
|---|---|
| A4 | 0.00 mm |
| B4 | 3.97 mm |
| C4 | 27.74 mm |
| D4 | 29.00 mm |
| E4 | 47.50 mm |
| F4 | 51.50 mm |
| G4 | 88.70 mm |
| H4 | 94.50 mm |
| I4 | 8.50 mm |
| J4 | 20.00 mm |
| K4 | 29.50 mm |
| L4 | R1.72 mm |
| M4 | 112.00 mm |
| N4 | 91.20 mm |
| O4 | 8.34 mm |
| P4 | Cbore 6.50 mm Dia, 4X, 1.13 mm deep |
| Q4 | 115.30 mm |
| R4 | 111.62 mm |
| S4 | 75.22 mm |
| T4 | 15.00 mm |

Figure 5:
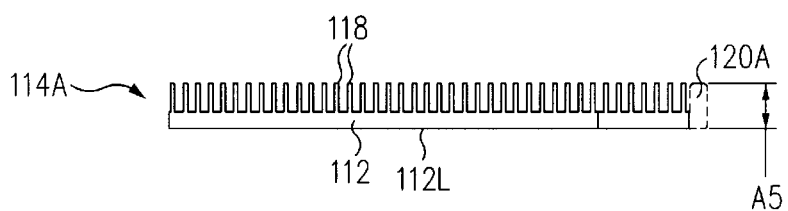
FIG. 5 is a side plan view of the heat sink of FIG. 4.

FIG. 5 is a side plan view of heat sink 114A of FIG. 4. An illustrative specification for the various characteristics illustrated in FIG. 5 is set forth below in Table 2.

TABLE 2

| CHARACTERISTIC | SPECIFICATION |
|---|---|
| A5 | 9.00 mm |

Figure 6:
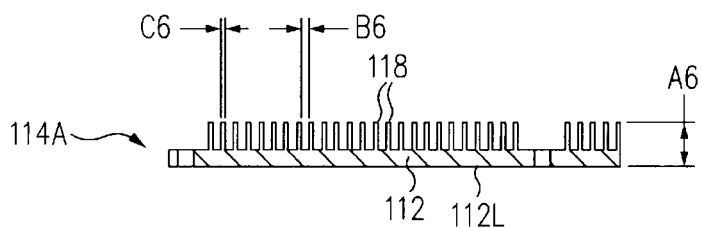
FIG. 6 is a cross-sectional view along the line VI—VI of the inner heat sink of FIG. 4.

FIG. 6 is a cross-sectional view along the line VI—VI of inner heat sink 114A of FIG. 4. Illustrative specifications for the various characteristics illustrated in FIG. 6 are set forth below in Table 3.

TABLE 3

| CHARACTERISTIC | SPECIFICATION |
|---|---|
| A6 | 9.50 mm |
| B6 | 2.18 mm |
| C6 | 0.66 mm |

Figure 7:
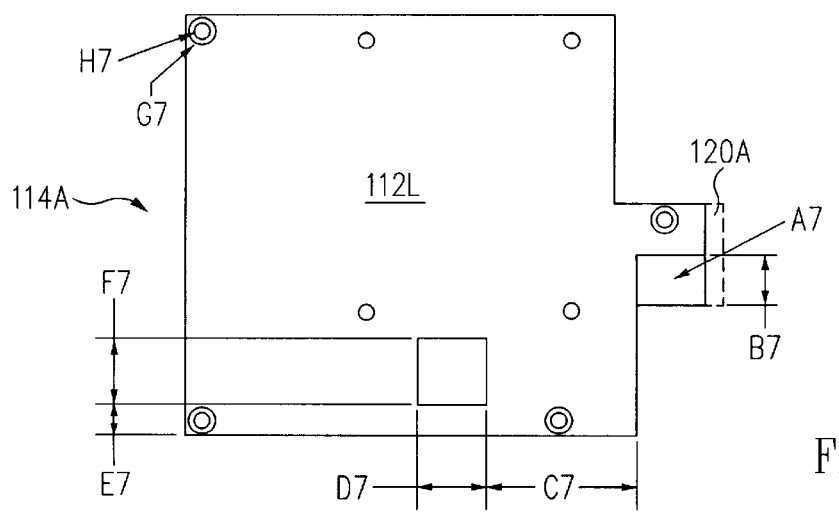
FIG. 7 is a bottom plan view of the inner heat sink of FIG. 4.

FIG. 7 is a bottom plan view of inner heat sink 114A of FIG. 4. Illustrative specifications for the various characteristics illustrated in FIG. 7 are set forth below in Table 4.

TABLE 4

| CHARACTERISTIC | SPECIFICATION |
|---|---|
| A7 | Mill areas 1.00 mm deep |
| B7 | 11.00 mm |
| C7 | 34.50 mm |
| D7 | 15.00 mm |
| E7 | 7.50 mm |
| F7 | 15.00 mm |
| G7 | Cbore, 6.50 mm Dia, 0.50 mm deep, 4X, this side |
| H7 | 3.5 mm Dia 4X thru, Cbore 8 MM Dia, 6.3 mm Deep, far side |

Inner heat sink 114A of FIGS. 4, 5, 6, and 7 is used alone, i.e., without an outer heat sink 130, or, alternatively, inner heat sink 114A includes an end plate 120A (illustrated in dashed lines), which is thermally connected to an outer heat sink 130 in a manner similar to that illustrated in FIGS. 1, 2, and 3.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A heat sink structure comprising:
   a first heat sink comprising a first heat transfer surface;
   a cabinet;
   a second heat sink comprising an end plate having a second heat transfer surface;
   a first screw passing through a first aperture in said cabinet and being threaded into a first threaded aperture in said first heat transfer surface, said first screw having a first head protruding into a first cavity in said end plate; and
   a second screw passing through a second aperture in said cabinet and being threaded into a second threaded aperture in said first heat transfer surface, said second screw having a second head protruding into a second cavity in said end plate.

2. The heat sink structure of claim 1 further comprising:
   a heat emitting component in thermal contact with said first heat sink.

3. The heat sink structure of claim 2 further comprising:
   a substrate, said heat emitting component being attached to said substrate.

4. The heat sink structure of claim 3 wherein said substrate is a printed circuit board.

5. The heat sink structure of claim 2 wherein said first heat sink further comprises a base section, said heat emitting component being in thermal contact with a first surface of said base section.

6. The heat sink structure of claim 5 wherein said second heat transfer surface is perpendicular to said first surface of said base section.

7. The heat sink structure of claim 2 wherein said cabinet defines a first region and a second region, said second region being cooler than said first region.

8. The heat sink structure of claim 7 wherein said heat emitting component and said first heat sink are in said first region.

9. The heat sink structure of claim 8 wherein said second heat sink is in said second region.

10. The heat sink structure of claim 1 wherein said second heat sink is positioned on said cabinet directly opposite of said first heat sink.

11. The heat sink structure of claim 10 wherein said second heat sink is in thermal contact with said first heat sink.

12. The heat sink structure of claim 1 further comprising a first thermal pad interposed between said first or second heat sink and said cabinet.

13. The heat sink structure of claim 1 wherein said cabinet is an outer cover of a computer system.

14. The heat sink structure of claim 1 wherein said second heat transfer surface is located at a first surface of said end plate, said second heat sink further comprising a plurality of fins extending from a second surface of said end plate.

15. A method comprising:
   thermally connecting a first heat sink to a heat emitting component;
   thermally connecting said first heat sink through a cabinet to a second heat sink comprising:

passing a first screw through a first aperture in said cabinet and threading said first screw into a first threaded aperture in said first heat sink;

passing a second screw through a second aperture in said cabinet and threading said second screw into a second threaded aperture in said first heat sink;

passing a third screw through a first aperture in said second heat sink, through a third aperture in said cabinet and threading said third screw into a third threaded aperture in said first heat sink; and passing a fourth screw through a second aperture in said second heat sink, through a fourth aperture in said cabinet and threading said fourth screw into a fourth threaded aperture in said first heat sink; and generating heat with said heat emitting component, wherein said heat is conducted to said first heat sink, to said cabinet, and to said second heat sink.

16. The method of claim 15 further comprising:

attaching said heat emitting component to a substrate.

17. The method of claim 16 wherein said substrate is a printed circuit board.

18. The method of claim 15 further comprising:

locating said second heat sink in a first region defined by said cabinet; and locating said first heat sink in a second region defined by said cabinet, wherein said first region is cooler than said second region.

19. The method of claim 15 wherein said first screw has a first head protruding into a first cavity of said second heat sink and wherein said second screw has a second head protruding into a second cavity of said second heat sink.

20. The method of claim 15 wherein said thermally connecting said first heat sink through a cabinet to a second heat sink further comprises:

locating a first thermal pad between said first heat sink and said cabinet; and locating a second thermal pad between said second heat sink and said cabinet.

* * * * *